Feb. 8, 1966 J. C. MARINACE 3,234,440

SEMICONDUCTOR DEVICE FABRICATION

Original Filed Dec. 30, 1959

INVENTOR
JOHN C. MARINACE

BY Alvin J. Riddles
ATTORNEY

United States Patent Office 3,234,440
Patented Feb. 8, 1966

3,234,440

SEMICONDUCTOR DEVICE FABRICATION

John C. Marinace, Yorktown Heights, N.Y., assignor to International Business Machines Corporation, New York, N.Y., a corporation of New York Original application Dec. 30, 1959, Ser. No. 863,000, now Patent No. 3,133,336, dated May 19, 1964. Divided and this application Aug. 14, 1962, Ser. No. 221,648
4 Claims. (Cl. 317—234)

This application is a division of application Serial No. 863,000, now Patent No. 3,133,336, filed Dec. 30, 1959.

This invention relates to the fabrication of semiconductor devices and in particular to the fabrication of a plurality of semi-conductor devices in a single operation.

In the semiconductor art, problems have been encountered in the fabrication of a large number of semiconductor devices by the fact that the small physical size of the device results in handling problems in cutting to size, in properly orienting the device for the attachment of electrodes and in positioning for service. Further, additional problems have been encountered where the devices are made in a plurality of separate fabrication operations so that the same process steps are not applied to each one and hence the output characteristics of the device are different. Under these conditions it is frequently necessary to perform very detailed measurements in order to match up characteristics so that identical performance may be realized from all similar devices in an individual circuit.

What has been discovered is a technique of simultaneously fabricating a plurality of semiconductor devices in a single processing operation wherein all devices are simultaneously made in spatial relationship in the same process steps so that each device will exhibit identical performance charcteristics and that as a part of the process, a fixture employed in the manufacture is later useable for the purpose of retaining the devices so made for further fabrication into a matrix.

It is an object of this invention to provide an improved technique of fabricating an array of semiconductor devices.

It is another object of this invention to provide a fixture for the fabrication and retention of a plurality of semiconductor devices.

It is another object of this invention to provide a method of depositing an array of semiconductor devices.

It is another object of this invention to provide an improved method of handling the small physical sizes of semiconductor devices.

It is another object of this invention to provide a method of forming a diode matrix.

The foregoing and other objects, features and advantages of the invention will be apparent from the following more particular description of a preferred embodiment of the invention as illustrated in the accompanying drawings.

It has been discovered that the use of an apertured glass plate in connection with an epitaxial germanium vapor deposition process permits the simultaneous deposition of a plurality of devices on a germanium substrate. The glass matrix may be used more than once or in the alternative the glass matrix has been found to be of great advantage in retaining the extremely small sizes of the semiconductor devices made. The matrix is fabricated from a thin plate of glass or a material similar to glass which has the following properties. It has low electrical conductivity and low chemical activity. The material is sufficiently refractory to withstand the temperatures involved in the deposition. It is sufficiently strong to support a matrix of devices and it has a coefficient of expansion that is close to that of the semiconductor material used. It has been found that the material glass has a temperature coefficient of expansion compatible with that of germanium, so that the use of this material with germanium is particularly advantageous.

Figure 1:
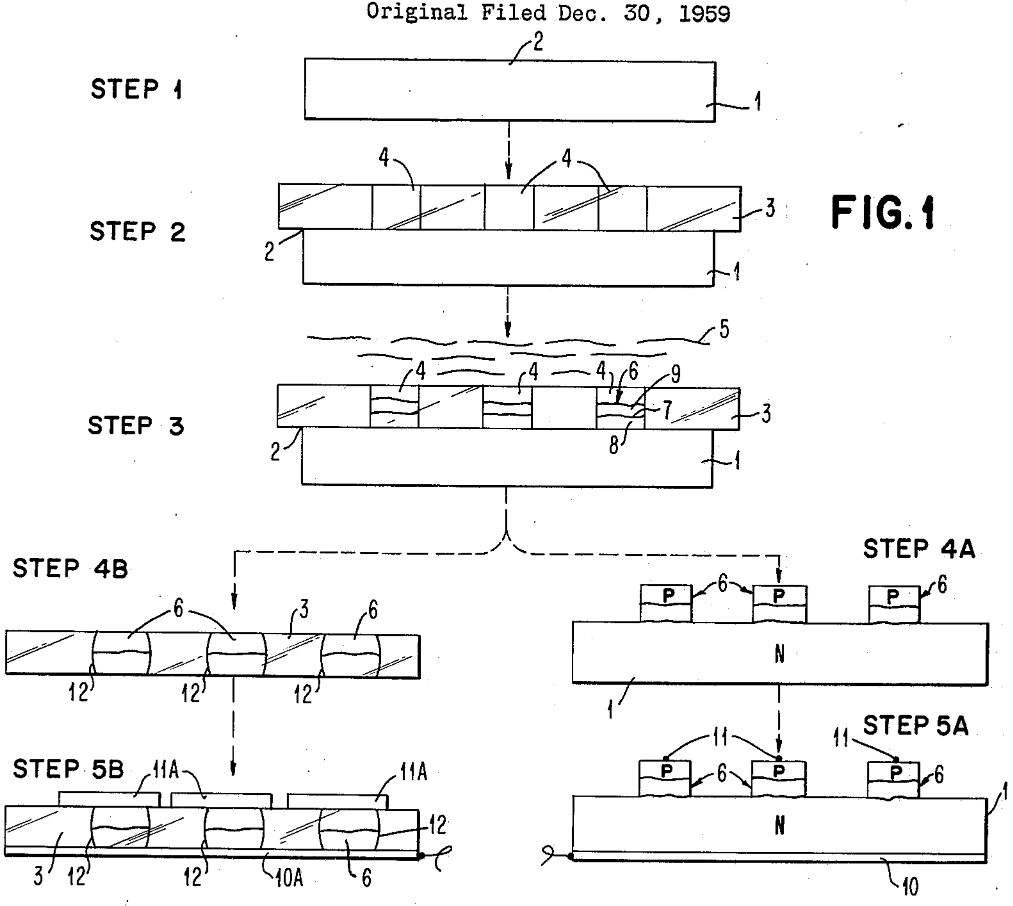
FIG. 1 is a flow chart of the germanium semiconductor device fabrication process in accordance with the invention.

Referring now to FIG. 1, a flow chart is shown in a process involving the invention wherein in a first step a substrate 1 for example of germanium semiconductor material is monocrystalline form is provided. The substrate material has a major surface 2 upon which the deposition is to take place. The substrate 1 is generally previously formed through the conventional technique of monocrystalline growing by pulling the crystal from a melt in a manner well known in the art. The single crystal is then sliced longitudinally to provide a relatively large surface 2 for the deposition.

Figure 2:
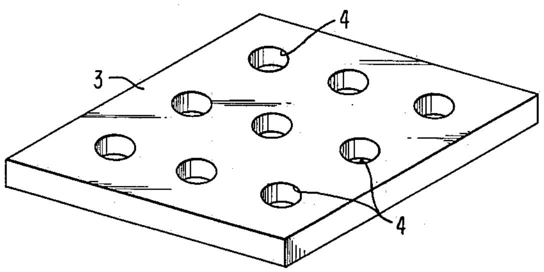
FIG. 2 is a view of a matrix employed in the fabrication of semiconductor devices.

In step 2, and in FIG. 2, a fixture 3 meeting the above described criteria, for example glass is placed in contact with the substrate 1 on the surface 2. The glass fixture 3 is shown wherein portions 4 of the plate have been subjected to a cutting operation such as grinding, sand blasting, ultrasonic cutting or acid etching to produce any desired array of holes or slots through the fixture exposing the surface 2. The slots 4 or holes go clear through the plate from one side to the other, and the walls of the holes or slots may be provided with sufficient interlocking shape to permit devices deposited in the holes in a later step to be retained therein. This may be done either by leaving the walls of the holes rough or by shaping them such that the deposited material is retained. Where it is desired to leave the deposited material attached to the substrate 1, the walls of the holes 4 may be made smooth for easy removal of the matrix 3.

Returning to FIG. 1, step 2, the surface 2 is preferably first etched by reversing the deposition reaction and removing some of the material from this surface of the substrate. This exposes a clean surface on which the deposition is to take place.

In step 3, germanium material is deposited from a gas 5 and grows epitaxially on the substrate 1 from the interface 2 in the form of elements 6 within the holes. The gas 5 in connection with the deposition process is a halide vapor, usually germanium di-iodide ($GeI_2$) which is decomposed or disproportionates in the vicinity of the substrate 1 such that free germanium and germanium tetraiodide ($GeI_4$) are formed. The free germanium deposits with the same periodicity of crystal structure as that of the original substrate 1. The method of vapor deposition has been established in the art and two techniques of its practice are described in U.S. Patent No. 3,020,132 and copending application Ser. No. 815,956, filed May 26, 1959, now Patent No. 3,089,788, both of which are assigned to the assignee of this application.

The introduction of conductivity type determining impurities is under complete control in this type of process and any quantity in any gradation and concentration may be introduced into the devices 6. Where PN junctions are formed in the devices 6, the PN junction may be formed either at the interface 2 or within the actual body of element 6 by changing the concentration of the conductivity type determining impurity present in the gas 5. It has been found that the semiconductor material does not deposit to any appreciable degree on the fixture 3 and what little does deposit may easily be removed by lapping.

As an illustration of the deposition of diodes, a PN junction 7 is shown in the device 6 made by a multiple step deposition process wherein a first deposition step N conductivity type determining impurities are introduced into the semiconductor material in the first region 8 extending epitaxially from the surface 2 and thereafter P conductivity type determining impurities are introduced into the elements 6 in a second region 9. This forms a PN junction between the two regions and is useable as a diode.

The partial product produced in step 3 may now be fabricated into a semiconductor devices in one of two directions either by using the fixture 3 to retain the deposited elements or by removing the fixture 3 leaving the deposited devices retained on the substrate.

Considering first step 4A, wherein the fixture 3 is removed and the individual semiconductor devices 6 are retained on a substrate 1 in the form of a plurality of diodes. The diodes 6 by virtue of being monocrystalline extensions of the substrate 1 all have one electrode thereof connected to a common point so that they may then receive a single plated connection to the substrate 1. With this type of structure the substrate 1 serves as a supporting element to maintain all of the plurality of semiconductor devices 6 that have been fabricated in a single structure. The structure shown in step 4A, is then provided in step 5A with electrical connections 10 and 11 such as by soldering or other techniques well known in the art to provide a completed matrix wherein an individual ohmic contact 10 is provided to the entire surface of the substrate 1, and individual contacts 11 which are shown attached to the P region of each of the diodes 6.

The fabrication of matrices of semiconductor devices employing the fixture 3 to retain the devices, in accordance with the invention is accomplished in connection with steps 4B and 5B. In these steps the matrix 3 may be separated from the substrate 1 through an etching or abrading operation after the deposition whereby the elements 6 are permitted to remain imbedded in the matrix and the matrix itself serves as a fixture to retain the plurality of semiconductor elements in the proper relationship. When it is desired to employ the fixture 3 to retain the devices, the sides of the holes 4 are usually so constructed as to grip the devices. This feature has been shown in steps 4B and 5B in the walls of the holes 4 are equipped with a device retaining feature 12 shown by the fact that the hole is larger in the central portion of the fixture 3 than at the edge.

Figure 3:
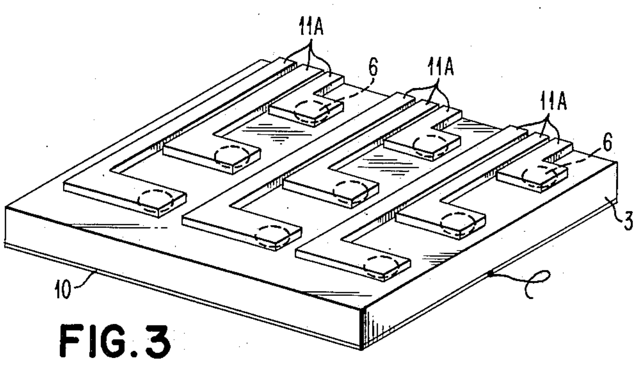
FIG. 3 is a complete matrix of fabricated semiconductor devices.

In step 5B, the fixture 3 containing the deposited devices 6 is equipped with ohmic connections to provide a useful circuit component. For example, the connections may be a solid ohmic contact 10A joining the same electrode of all diodes within the fixture 3 and on the opposite side of the fixture 3 a plurality of individual conductors 11A are made employing standard printed wiring techniques, such as plating, known in the art, to the individual diodes. Such structure is shown in FIG. 3 wherein a complete matrix of semiconductor devices is illustrated wherein each of the devices 6 was formed in and is retained in use by the glass matrix 3. In FIG. 3, as an illustration, the common ohmic contact 10 is plated on the back of the matrix 3 joining one electrode of all devices 6 and individual contacts 11A are plated in the opposite surface of the glass connecting the remaining electrode on the devices 6.

What has been described is a technique of simultaneously fabricating complete matrices of semiconductor devices in spatial relationship to each other through the technique of vapor deposition employing a fabrication fixture which may serve to establish the spatial relationship of the devices and to act as a retaining member for individual discrete semiconductor devices in service.

While the invention has been particularly shown and described with reference to a preferred embodiment, it will be understood by those skilled in the art that various changes in form and details may be made therein without departing from the spirit and scope of the invention.

What is claimed is:

1. A semiconductor device matrix comprising a monocrystalline semiconductor element having at least one major surface; a device-defining insulating mask in contact with said at least one major surface; at least two semiconductor devices comprising semiconductor material, formed within said apertures in said device-defining mask spatially separated on said major surface, in contact with said element to define semiconductor junctions respectively within said apertures above the surface of said element: and at least one ohmic contact on each said semiconductor device.

2. The semiconductor device matrix of claim 1 wherein said semiconductor material is germanium.

3. A germanium semiconductor device array comprising a glass member; a plurality of semiconductor devices, each device comprising semiconductor material, on a common monocrystalline substrate, within and extending through and supported by said glass member having apertures therein conforming to said devices, to define semiconductor junctions respectively within said apertures, the cross sectional dimension of each said aperture intermediate the surfaces of said glass member and said substrate being larger than the cross sectional dimension of each said aperture at either the surface of said glass member or said substrate; and at least one electrical current carrying member connected to each said device and supported by said glass member.

4. A semiconductor device matrix of individual semiconductor devices, each retained in spatial relationship to the other comprising, in combination, a common substrate; a semiconductor-device-retaining insulating material having apertures therein; at least two monocrystalline semiconductor device bodies comprising semiconductor material formed in contact with said common substrate to define semiconductor junctions respectively within said apertures in a plane between the surfaces of said device-retaining insulating material; and at least one ohmic contact to each said semiconductor device.

References Cited by the Examiner

UNITED STATES PATENTS

| | | | |
|---|---|---|---|
| 2,498,714 | 2/1950 | Searle | 317—234 |
| 2,629,802 | 2/1953 | Pantchechnikoff | 317—235 |
| 2,680,220 | 6/1954 | Starr et al. | 317—235 |
| 2,692,839 | 10/1954 | Christensen et al. | 317—235 |
| 2,791,731 | 5/1957 | Walker et al. | 317—234 |
| 2,804,581 | 8/1957 | Lichtgarn | 317—235 |
| 2,844,770 | 7/1958 | Van Vessem | 317—234 |
| 2,858,489 | 10/1958 | Henkels | 317—235 |
| 2,910,634 | 10/1959 | Rutz | 317—235 |
| 2,982,002 | 5/1961 | Shockley | 317—234 |
| 3,025,438 | 3/1962 | Wegener | 317—235 |

JOHN W. HUCKERT, *Primary Examiner.*

JAMES D. KALLAM, DAVID J. GALVIN, *Examiners.*